United States Patent [19]

Kato et al.

[11] Patent Number: 4,924,351

[45] Date of Patent: May 8, 1990

[54] RECESSED THERMALLY CONDUCTIVE PACKAGED SEMICONDUCTOR DEVICES

[75] Inventors: Toshihiro Kato; Shinjiro Kojima, both of Chigasaki; Takao Emoto, Yokosuka; Hiroshi Matsumoto, Hyogo, all of Japan

[73] Assignee: Kabushiki Kaisha Toshiba, Kawasaki, Japan

[21] Appl. No.: 334,771

[22] Filed: Apr. 10, 1989

Related U.S. Application Data

[63] Continuation of Ser. No. 134,610, Dec. 4, 1987, abandoned, which is a continuation of Ser. No. 873,705, Jun. 12, 1986, abandoned.

[30] Foreign Application Priority Data

Jun. 20, 1985 [JP] Japan .............................. 60-134658
Sep. 30, 1985 [JP] Japan .............................. 60-214852
Mar. 31, 1986 [JP] Japan .............................. 61-071134

[51] Int. Cl.$^5$ .............................................. H05K 7/20
[52] U.S. Cl. ................................... 361/386; 361/385; 174/52.2
[58] Field of Search ............... 361/385, 386, 387, 388; 264/272.17; 174/52.1, 52.2, 52.3, 52.4

[56] References Cited

U.S. PATENT DOCUMENTS

| | | | |
|---|---|---|---|
| 3,585,455 | 6/1971 | Naylor | 361/386 X |
| 3,646,409 | 2/1972 | van de Water et al. | 174/52 PE X |
| 3,689,804 | 9/1972 | Ishihama et al. | 174/52 PE |
| 3,706,840 | 12/1972 | Moyle et al. | 174/52 PE |
| 3,767,839 | 10/1973 | Beal | 174/52 PE X |
| 3,839,660 | 10/1974 | Stryzer | 174/52 PE |
| 3,930,114 | 12/1975 | Hodge | 264/272.17 X |
| 4,048,670 | 9/1977 | Eysermans | 174/52 PE X |
| 4,467,522 | 9/1984 | Marchisi | 264/272.17 X |
| 4,481,380 | 11/1984 | Wood et al. | 174/52 PE |
| 4,483,067 | 11/1984 | Parmentier | 174/52 PE X |
| 4,542,260 | 9/1985 | Pearce | 174/52 PE |
| 4,628,146 | 12/1986 | Schmotz et al. | 174/52 PE |
| 4,642,716 | 2/1987 | Wababayashi et al. | 174/52 PE |

OTHER PUBLICATIONS

TOSHIBA REVIEW (vol. 35, No. 2) p. 141, "A High--Output Photothyristor Coupler"; Hiroaki Takasago, Takao Katayama, Feb. 1980.

*Primary Examiner*—William M. Shoop, Jr.
*Assistant Examiner*—A. Jonathan Wysocki
*Attorney, Agent, or Firm*—Oblon, Spivak, McClelland, Maier & Neustadt

[57] ABSTRACT

A packaged semiconductor device having a semiconductor chip mounted on a bed part, a first molded layer which seals the bed part and the semiconductor chip such that the back of the bed part is exposed, a heat sink under the exposed back of the bed part and with a prescribed distance between it and the back of the bed part a second molded layer which is formed such that it covers the outside of the heat sink and the first molded layer, and also fills the gap between the exposed surface of the bed part and the heat sink, and leads which are disposed such that they pass through the second molded layer and their ends are in the first molded layer, and which are connected via bonding wires to the internal terminals of the semiconductor chip.

2 Claims, 4 Drawing Sheets

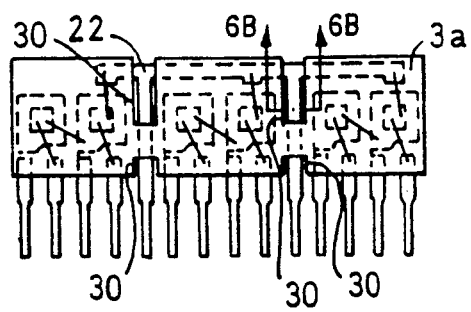
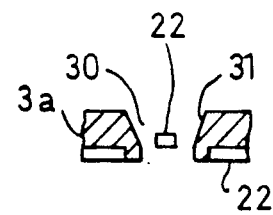
FIG. 6(A)  FIG. 6(B)
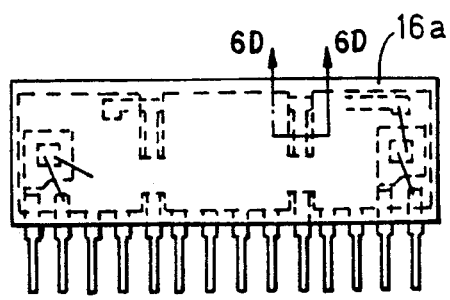
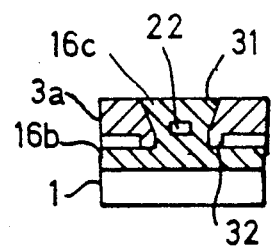
FIG. 6(C)  FIG. 6(D)
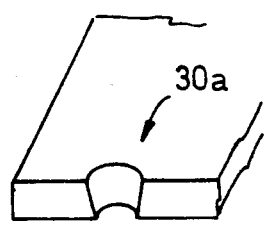
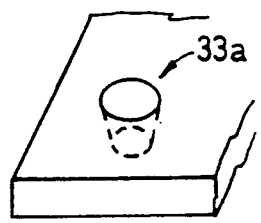
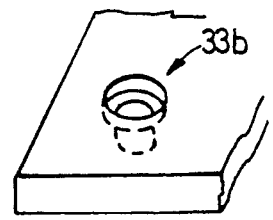
FIG. 7(A)  FIG. 7(B)  FIG. 7(C)

RECESSED THERMALLY CONDUCTIVE PACKAGED SEMICONDUCTOR DEVICES

This application is a continuation of application Ser. No. 07/134,610 filed on Dec. 14, 1987, now abandoned which is a continuation of application Ser. No. 873,705, filed on June 12, 1986, now abandoned.

BACKGROUND OF THE INVENTION

1. Field of the Invention

This invention relates to a packaged semiconductor device. In particular, it concerns the improvement of a packaged semiconductor device having a heat sink insulated from the semiconductor chip.

2. Description of the Prior Art

A known configuration for power semiconductor devices with e.g. a power transistor array is that in which a plurality of semiconductor chips are mounted on one heat sink and sealed with a single layer of molded resin. In this type of semiconductor device, the individual semiconductor chips and the heat sink must be insulated from each other. For this reason, a ceramic substrate is used initially, but owing to the high cost of this substrate and problems with its workability, various substitutes are proposed.

A construction for a packaged semiconductor device which did not employ a ceramic substrate is proposed. The semiconductor chips could be insulated from each other, using an ordinary metal heat sink. This construction is explained below, referring to FIGS. 1 through 4.

FIG. 1 is a plan view of a heat sink 1 consisting of a metal plate of high thermal conductivity, of aluminium or the like. Screw holes 11 are formed in this heat sink 1, for securing to a cooling body. FIG. 2 is a plan view of a lead frame 2 patterned with thin plate of conductive metal such as copper or steel alloy. As the drawing shows, four independent bed parts 21 and lead patterns 22 are formed on lead frame 2, and these are supported by being connected to a frame 23.

To obtain this construction, the semiconductor chips are die-bonded on to bed parts 21 of lead frame 2, and the necessary wire-bonding is then effected. Then the frame is placed in a metal mold die set together with heat sink 1 and transfer molding is carried out. When this is done, lead frame 2 is placed over heat sink 1 with a prescribed gap. This gap is then filled with molded resin. FIG. 3 is a plan view showing the state after the sealing with resin. Numeral 3 in the drawing is a molded layer.

FIG. 4 is a sectional view along the line V—V in FIG. 3. As shown in FIG. 4, a semiconductor chip 4 is die-bonded on to bed part 21 via a solder layer 5. Bonding wires 6 are interconnected between chip 4 and lead frame 2. As the drawing shows, in this construction molded resin layer 3 is filled in the gap between lead frame 2 (in particular bed part 21) and heat sink 1, and by this means insulation is achieved between the two.

Thermal dissipation characteristics in the construction described above depends on the thermal conductivity of the molded resin layer interposed between bed part 21 and heat sink 1. The resin used for molded resin layer 3 is therefore epoxy resin with its thermal conductivity Tc increased by an admixture of crystalline silica powder (Tc=2.5 W/(m·K)).

The admixture of a large quantity of crystalline silica unavoidably increases the viscosity of the resin of high thermal conductivity which used in existing packaged semiconductor devices. For this reason, voids are liable to occur, when forming resin layer 3 by transfer molding, in the resin layer which fills the space between bed part 21 and heat sink 1. These voids reduce the breakdown voltage. This tendency is proportional to the viscosity of the melting resin, and in inverse proportion to the distance between the bed part and the heat sink. The problem arose that when an attempt is made to increase the thermal dissipation characteristics by increasing the silica content, the marked generation of voids resulted in reduced breakdown voltage. Other problems caused by increased viscosity of the melting resin are greater flow resistance of the melting resin and poor bonding, with breaking of bonding wires, etc.

When an attempt is to be made to increase the silica content and yet at the same time to inhibit the generation of voids, the distance between the bed part and the heat sink must be made greater. In that case the thermal resistance of the resin layer is increased and improvement in thermal dissipation characteristics is no longer obtained. It may be noted here that when epoxy resin, containing crystalline silica, of Tc=2.5 W/(m k) is used for the molding, with a bed 21 of 8 mm×8 mm, the generation of voids made it impossible to reduce the distance between the bed part and the heat sink below 0.5 mm.

SUMMARY OF THE INVENTION

It is an object of the present invention to provide a packaged semiconductor device in which the distance between the bed part and the heat sink is shortened, the generation of voids is prevented, the crystalline silica content of the molded resin layer interposed between the bed part and the heat sink can be increased, and thermal dissipation characteristics are improved without decreasing the dielectric breakdown.

Another object of this invention is to provide a packaged semiconductor device wherein the adhesion of the first and second molded resin layers is improved, the reliability with which the device can withstand mechanical shock is improved.

A further object of this invention is to provide a packaged semiconductor device in which the mechanical strength of the bed part is increased.

The packaged semiconductor device of the invention is characterized in that it is provided with semiconductor chip mounted on a bed part, a first molded layer which seals the bed part and the semiconductor chip such that the back of the bed part is exposed, a heat sink which is disposed at a prescribed distance under the exposed back of the bed part, a second molded layer which is formed such that it covers the outside of the heat sink and the first molded layer, and also fills the gap between the exposed face of the bed part and the heat sink, and leads which pass through the second molded layer and have their ends in the first molded layer, and are also connected via bonding wires to internal terminals of the semiconductor chip.

BRIEF DESCRIPTION OF THE DRAWINGS

FIG. 6(A) is a plan view of a packaged semiconductor device of a second embodiment accordance with the present invention, with a first molded layer applied.

FIG. 6(B) is a partial enlarged sectional view along the line B—B in FIG. 6(A).

FIG. 6(C) is a plan view of a packaged semiconductor device of a second embodiment accordance with the present invention, with the second molded layer applied.

FIG. 6(D) is a partial enlarged sectional view along the line D—D in FIG. 6(C).

FIGS. 7(A)–(C) are partial oblique views of the first molded layer part of the second embodiment.

DESCRIPTION OF THE PREFERRED EMBODIMENTS

Figure 1:
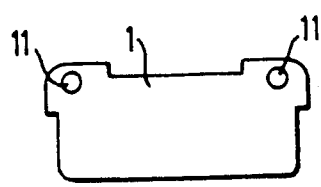
FIG. 1 is a plan view of a conventional heat sink.
Figure 2:
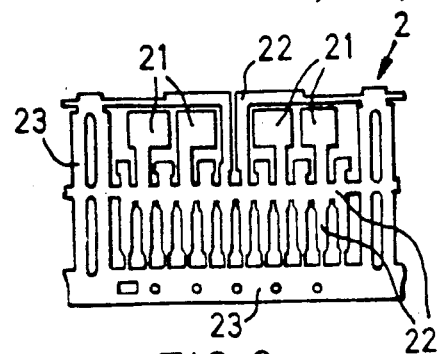
FIG. 2 is a plan view of a conventonal lead frame.
Figure 3:
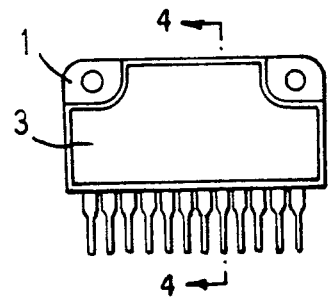
FIG. 3 is a plan view of a conventonal packaged semiconductor device.
Figure 4:
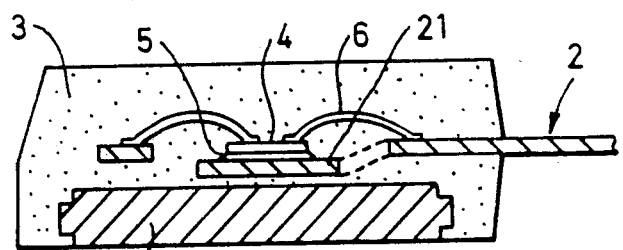
FIG. 4 is a sectional view taken along line V—V of FIG. 3.
Figure 5:
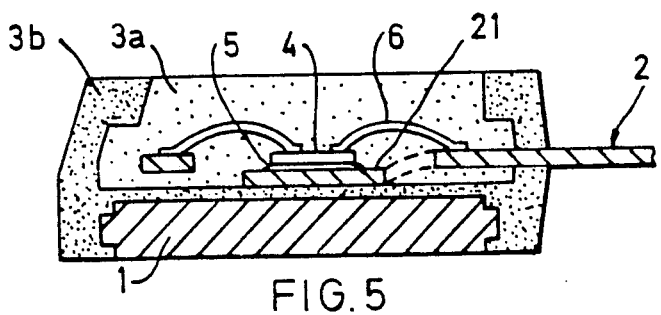
FIG. 5 is a sectional view of a packaged semiconductor device of a first embodiment accordance with the present invention.

FIG. 5 is a sectional view of a packaged semiconductor device constituting a first embodiment of the invention.

In this drawing the parts which are the same in FIGS. 1 through 4 are numbered as in those drawings. A semiconductor chip 4 is die-bonded on to a bed part 21 via a solder layer 5 such as a Pb-Sn-Ag solder alloy. Bonding wires 6 consisting of fine metal wire of Au, Al, etc. is interconnected between chip 4 and a lead frame 2. As the drawing shows, in this construction a molded layer 3 is filled in the gap between lead frame 2 (in particular bed part 21) and a heat sink 1, and by this means insulation is achieved between the two. In this embodiment, the molded layer is of two-layer construction, made-up of a first molded layer 3a and a second molded layer 3b, for example, both consisting of epoxy resin which contains crystalline silica and is of high thermal conductivity. The epoxy resin used for the first molded layer is of thermal conductivity Tc=2.5 W/(m·K); that used for the second, of thermal conductivity Tc=2.5–4.2 W/(m·K). The size of bed part 21 is 10 mm×10 mm, and the distance between the bed part and the heat sink is 0.3 mm.

In the manufacture of the packaged semiconductor device of this embodiment, semiconductor chip 4 is first die-bonded on to lead frame 2 and wire-bonded, in the same way as in the manufacture of the conventional device, after which a resin layer is effected by forming first molded layer 3a by means of transfer molding. Next, heat sink 1 is placed in a transfer mold die set. The lead frame formed the first molded layer is placed in the mold over the heat sink with prescribed gap. Second molded layer 3b is formed by transfer molding. In this second transfer molding, the melting resin first flows between heat sink 1 and the first molded layer, then around the outside of the first molded layer. Consequently, in this embodiment, the air between the bed part and the heat sink escapes to the outside. And this gap is filled with resin of high thermal conductivity without any voids.

In the packaged semiconductor device of this embodiment, since the distance between the bed part and the heat sink is shortened to 0.3 mm, or half the conventional figure, and the gap is filled with resin of high termal conductivity, the thermal resistance of the resin layer in this gap is improved from the conventional 3.4° K/W to 1.8° K/W or approximately 47%. Also, since the formation of voids in the molded layer in this gap is almost completely prevented, the problem of decreasing the dielectric breakdown does not arise.

Specific devices to which the invention can be effectively applied include diode arrays, solid state relays and photocouplers, in addition to transistors and transistor arrays.

As described above, since the bed part and heat sink are insulated from each other by interposing the second molded layer and the distance between the bed part and the heat sink is shortened, the outstanding effects are obtained as follows. The generation of voids between them is prevented, the crystalline silica content of the molded layer interposed between them can be increased, and thermal dissipation characteristics can thus be improved without decreasing the dielectric breakdown.

As described above, the essential point of the invention is the division of the molded layer into two, with a second molded layer being formed by transfer molding after the formation of a first molded layer. Since in this case the flow of the melting resin is different from the flow in the manufacture of a conventional device, the part where air finally accumulates is not the gap between the bed part and the heat sink, but the area outside the first molded layer. The result of this is that even when highly viscous resin is used for the second molded layer, and the size of the gap between the bed part and the heat sink is reduced, the formation of voids in the resin filling the gap is prevented. It therefore becomes possible to use resin of high thermal conductivity, with a large crystalline silica content, for the second molded layer, and thereby to improve thermal dissipation characteristics without decreasing the dielectric breakdown.

Also, since the first molded layer is already in place when the second molded layer is formed, there is no risk of bondings being broken even when carrying out transfer molding with highly viscous melting resin.

Insulation between the semiconductor chip and the heat sink is required not only when a plurality of semiconductor chips are sealed within one package, but also in a semiconductor device in which only one semiconductor chip is sealed. When a plurality of semiconductor devices are arranged, each with its heat sink fixed to the same thermal dissipation plate, obviously they all require similar insulation. The invention has its characteristic effect, not only in the semiconductor device explained in FIGS. 1 through 4, but also when applied to a packaged semiconductor device in which a single semiconductor chip is sealed.

Next, a second embodiment of the invention is explained, referring to the drawings. In this drawing the parts which are the same in FIG. 5 are numbered as in those drawings.

FIG. 6(A) is a plan view of a component in which notches 30 are provided in four places in the periphery of first molded layer 3a. FIG. 6(B) is a partial enlarged sectional view along the line B—B in FIG. 6(A). In order to ensure perfect bonding with the second molded layer, these notches 30 in FIG. 6(A) are provided at the part where lead pattern 22 is exposed by a notch.

FIG. 6(C) is a plan view of the finished embodiment, when the second molded layer is applied. FIG. 6(D) is a partial enlarged sectional view along the line D—D in FIG. 6(C). In the second molded layer of this second embodiment, the epoxy resin is filled the area 16a around first molded layer 3a and heat sink 1 and a gap 16b between first molded layer 3a and heat sink 1. The additional feature is that the epoxy resin also fills insides 16c of the notches in the first molded layer. Since taper 31 of notches 30 constitutes an undercut in relation to the second molded layer (the angle of the taper is preferably at least 5°, or better sill, at least 10°), adhesion at the interface 32 between the first and second molded layers is improved.

FIG. 7 shows the shapes of different notches and of through-holes. The invention is not restricted to the notches 30, 30a on the periphery of the first molded layer, as shown in FIGS. 6(D) and 7(A). Through-holes 33a, 33b in the first molded layer, as shown in FIGS. 7(B) or (C), may also be used. It is evident, further, that the notches or through-holes are not restricted to those tapered to form an undercut in relation to the second molded layer, as shown in FIGS. 6(D), 7(A) and (B). And they can be stepped so as to form an undercut in relation to the second molded layer, as shown in FIG. 7(C).

The effects obtained with a double-molded packaged semiconductor device according to the invention are that since adhesion between the first and second molded layers is improved, the ability of the device to withstand mechanical shock is increased, and the interface between the two molded layers is not subject to cracking or the entry of air gaps, so that the thermal dissipation characteristics of the device are stable.

Next, a detailed explanation follows of a third embodiment of the invention, referring to FIG. 8 through FIG. 11. In this drawing the parts which are the same in FIG. 5 are numbered as in those drawings.

Figure 8:
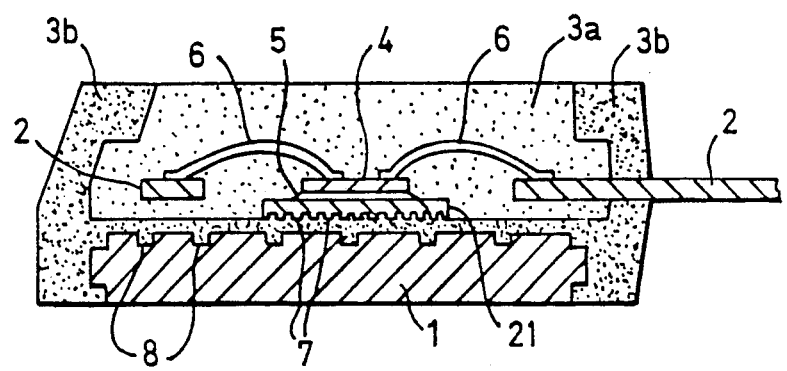
FIG. 8 is a sectional view showing a third embodiment of the packaged semiconductor device of the invention.

In FIG. 8, numeral 1 is a heat sink consisting of a metal plate of high thermal conductivity, of aluminium or copper plate or the like. Numeral 21 are the bed parts of lead frame 2. Lead frame 2 is formed by the patterning of electrically conductive metal plate such as copper or steel alloys or the like. Bed part is e.g. $10 \times 10$ mm. Semiconductor chip 4 are die-bonded on to it by a solder layer 5 of mounting agent such as solder alloy or the like, and the prescribed electrical connection is made between the internal terminals of chip 4 and the end parts of lead frame 2 by wire-bonding by means of fine metal wires of Au, Al or the like.

Bed part 21, the end parts of lead frame 2, solder layer 5, semiconductor chip 4, and bonding wires 6 are sealed by means of a first molded layer 3a such that the back of bed part 21 is exposed. Heat sink 1 is disposed under the back of bed part 21 at a prescribed distance (e.g. of 0.3 mm) from it, and a second molded layer 3b is formed such that it fills the gap between these, and also covers the sides of first molded layer 3a, the sides of heat sink 1, and the intermediate pats of lead frame 2. Thus molded layer 3 made up of two layers, and both layers 3a, 3b consist of epoxy resin of high thermal conductivity, containing crystalline silica. For first molded layer 3a, epoxy resin of Tc (thermal conductivity)=2.5 W/(m·K) is used, and for second molded layer 3b, epoxy resin of higher thermal conductivity, namely Tc=2.5-4.2 W/(m·K).

Figure 9A:
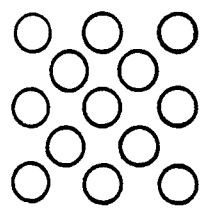
FIGS. 9(a)–(e) are plan views of different examples of recesses formed in the back of the bed part in FIG. 8 or the upper surface of the heat sink in FIG. 8.
Figure 9B:
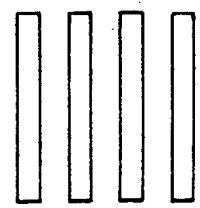
Figure 9C:
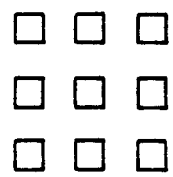
Figure 9D:
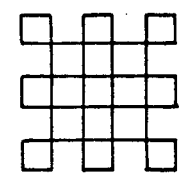
Figure 9E:
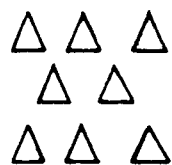

A plurality of recessed parts 7 are formed along the back of bed part 21, and a plurality of recessed parts 8 are formed on the upper surface of heat sink 1. These recessed parts 7 and 8 are pre-formed on the back of bed part 21 and the upper surface of heat sink 1 by mechanical working: for example, the recessed parts are first formed by coining, after which their surfaces are roughened by honing. FIGS. 9(a)–(e) give examples of different plane configurations of these recessed parts formed by coining. FIG. 9(a) shows round holes; FIG. 9(b), vertical channels; FIG. 9(c), square holes arranged in rows; FIG. 9(d), square holes arranged in a checkerboard pattern; and FIG. 9(e), triangular holes.

Figure 10:
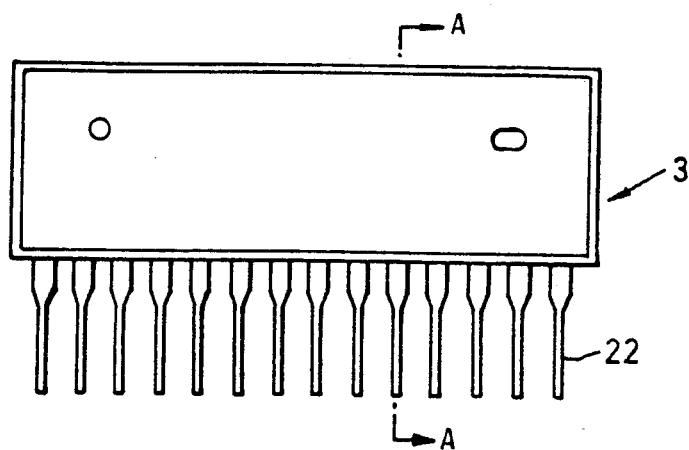
FIG. 10 is a plan view of the exterior of the third embodiment of FIG. 8.

In the manufacture of the packaged semiconductor device of this embodiment, semiconductor chip 4 is first die-bonded on to lead frame 2 and wire-bonded, in the same way as in the manufacture of the first embodiment, after which a molded layer is effected by forming first molded layer 3a by means of transfer molding. Next, heat sink 1 is placed in a transfer mold. Then the resin-sealed lead frame 2 is placed over heat sink 1, with a prescribed gap between it and the heat sink, and in this state second molded layer 3b is formed by transfer molding. In this second transfer molding, the melting resin first flows between heat sink 1 and first molded layer 3a, then around the outside of heat sink 1 and first molded layer 3a. Consequently, the place where the air escapes to is the space where second molded layer 3b is formed, and the gap between heat sink 1 and first molded layer 3a is filled with resin of high thermal conductivity without any voids being formed. FIG. 10 is a front exterior view of the product obtained when the leads are formed after the molded layer is applied in the manner described above. FIG. 8 is a sectional view along the line A—A in FIG. 10.

In the packaged semiconductor device of the third embodiment described above, the forming of recessed parts 7 on the back of bed part 21 enlarges the area of bed part 21 in contact with second molded layer 3b, and thermal conductivity between these two 21 and 3b is thereby increased. Similarly, the forming of recessed parts 8 on the upper surface of heat sink 1 enlarges the area of heat sink 1 in contact with second molded layer 3b, and thermal conductivity between these two 3b and 1 is thereby increased. Consequently, thermal resistance Rth (J·C) between semiconductor chip 4 and heat sink 1 is greatly reduced, and the thermal dissipation characteristics of the semiconductor device are greatly improved. The forming of a plurality of recessed parts 7 on the back of bed part 21 also increases the mechanical strength of bed part 21. The difference from the first embodiment is the forming of recessed part 7 and 8: the embodiment retains all the features of the firat embodiment.

The invention is not restricted to the embodiment described above. Similar effects to those of the embodiment described above are obtained when recessed parts 7 and 8 are formed only by coining, or only by honing (either wet or dry), or when recessed parts 7 are formed on the back of the bed part only, with no recessed parts 8 being formed on the upper surface of the heat sink. The Table below gives the measured data for thermal resistance Rth (J·C) between the semiconductor chip and the heat sink in each of these cases. (1) in the Table represents the first embodiment; (2)–(5) represent different combinations of the places where, and the methods by which, the recessed parts are formed, the other conditions being the same as in construction (1). It can be seen from the Table that the Rth (J·C) of construction (5) is 1.6 K/W, or approximately 0.6 times smaller than that of construction (1), representing an improvement in thermal dissipation characteristics of approximately 40%.

|  | Back of bed part | | Upper surface of heat sink | | Thermal resistance |
|---|---|---|---|---|---|
|  | Coining | Honing | coining | Honing | Rth (J · C) (°K./W) |
| (1) | No | No | No | No | 2.7 |
| (2) | No | Yes | No | No | 2.3 |
| (3) | Yes | No | Yes | No | 2.0 |
| (4) | Yes | No | Yes | Yes | 1.9 |
| (5) | Yes | Yes | Yes | Yes | 1.6 |

It is confirmed, furthermore, that thermal resistance Rth (J·C) in the embodiment represented by (5) in the Table can be reduced to 1.4 K/W or less by using epoxy resin of even higher thermal conductivity (e.g. Tc=3.6 W/(m·K)) for second molded layer 3b.

Figure 11:
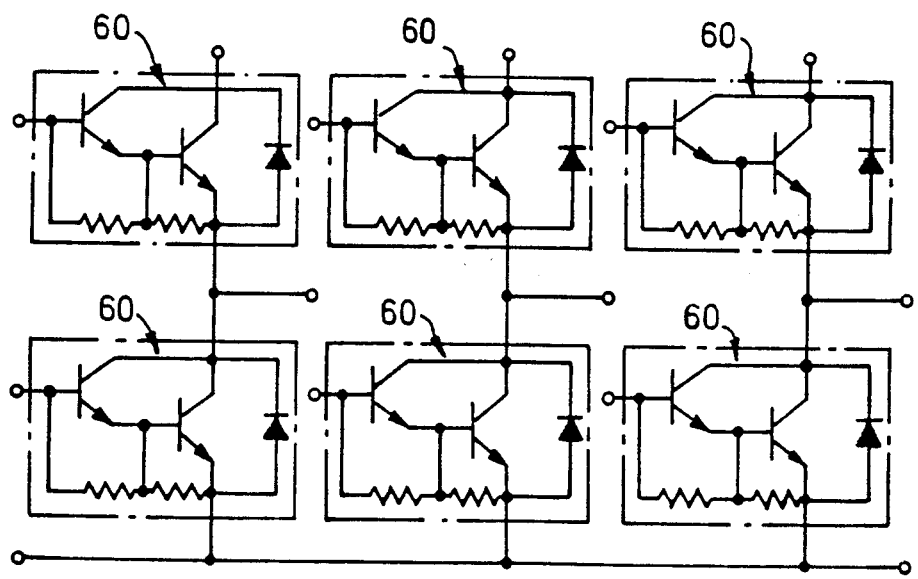
FIG. 11 is a circuit diagram showing an example of a power transistor array accordance with the present invention.

As an example of a power transistor array. FIG. 11 shows a circuit with six Darlington-connected power transistors 60. When the invention is applied to this type of power transistor array, its good thermal dissipation characteristics made it possible to achieve higher output, even with the other conditions (package size, etc.) unchanged.

The invention is not restricted to power transistor arrays, but is effective also when applied to diode arrays, power solid state relays, power photocouplers and the like. Again, the invention is not restricted to cases where a plurality of semiconductor chips are sealed within a single package, but is effective also when applied to a semiconductor device (power transistor, etc.) in which a single semiconductor chip is sealed.

As described above, the outstanding effects that can be obtained with a packaged semiconductor device according to the invention in which the bed part and the heat sink are insulated from each other by interposing a molded layer between them, are as follows. The distance between the bed part and the neat sink is shortened, the formation of voids between them is prevented, the crystalline silica content can be increased, and thermal dissipation characteristics can be improved without decreasing the dielectric breakdown. Also, since the provision of recessed parts on the back of the bed part enlarges the area of the bed part in contact with the molded layer interposed between them and the heat sink, thermal conductivity between the bed part and heat sink is thereby increased, and thermal dissipation characteristics are further improved.

When the double-molded construction described above is put into effect, the formation of voids in the gap between the bed part and the heat sink can be prevented even though this gap is made narrower and epoxy resin of high termal conductivity, with a large silica content, is used for the second molded layer, and thermal dissipation characteristics are improved without decreasing the dielectric breakdown.

Furthermore, the presence of recessed parts on the back of the bed part enlarges the area of the bed part in contact with the second molded layer, resulting in a reduction in thermal resistance between the bed part and the heat sink, and in a great improvement in thermal dissipation characteristics.

What is claimed is:

1. A packaged semiconductor device comprising:
   a bed part having front surface and back surface;
   a semiconductor chip mounted on said front surface of said bed part;
   a first molded layer which seals said front surface of said bed part and said semiconductor chip to expose said back surface of said bed part;
   a heat sink having first and second main surfaces, and facing said back surface of said bed part on said first main surface thereof with a gap of a prescribed distance from said back surface of said bed part;
   a second molded layer formed to cover an outside of said heat sink and said first molded layer and fill said gap from one direction; and
   leads which pass through said second molded layer, of which ends are disposed inside said first molded layer, and which are connected to internal terminals of said semiconductor chip;
   wherein at least one of the back surface of said bed part and the first main surface of said heat sink is provided with a plurality of roughened recessed parts.

2. A packaged semiconductor device comprising:
   a bed part having front surface and back surface;
   a semiconductor chip mounted on said front surface of said bed part;
   a first molded layer which seals said front surface of said bed part and said semiconductor chip to expose said back surface of said bed part;
   a heat sink having first and second main surfaces, and facing said back surface of said bed part on said first main surface thereof with a gap of a prescribed distance from said back surface of said bed part;
   a second molded layer formed to cover an outside of said heat sink and said first molded layer and fill said gap from one direction; and
   leads which pass through said second molded layer, of which ends are disposed inside said first molded layer, and which are connected to internal terminals of said semiconductor chip;
   wherein at least one of the back surface of said bed part and the first main surface of said heat sink is provided with a plurality of recessed parts; and
   wherein the recessed parts are provided on both said back surface of said bed part and said first main surface of said heat sink.

* * * * *